United States Patent [19]
Okubo et al.

[11] Patent Number: 4,774,413
[45] Date of Patent: * Sep. 27, 1988

[54] ION EMMISSIVE HEAD AND ION BEAM IRRADIATION DEVICE INCORPORATING THE SAME

[75] Inventors: Masao Okubo, Naka; Kiyoshi Sugaya, Ibaragi; Toshinori Takagi; Junzo Ishikawa, both of Kyoto University, Yosidahonmachi, Sakyo-ku, Kyoto-shi, all of Japan

[73] Assignees: Nihon Denshizairyo Kabushiki Kaisha, Amagasaki; Toshinori Takagi, Kyoto; Junzo Ishikawa, Kyoto, all of Japan

[*] Notice: The portion of the term of this patent subsequent to Jan. 20, 2004 has been disclaimed.

[21] Appl. No.: 919,409

[22] Filed: Oct. 16, 1986

[30] Foreign Application Priority Data

Oct. 23, 1986 [JP] Japan .................................. 60-238147

[51] Int. Cl.[4] .............................................. H01J 27/02
[52] U.S. Cl. ............................ 250/423 R; 250/423 F; 315/111.81
[58] Field of Search ...................... 250/423 R, 423 F; 315/111.81

[56] References Cited

U.S. PATENT DOCUMENTS

| | | | |
|---|---|---|---|
| 3,475,636 | 10/1969 | Eckhardt | 313/163 |
| 4,456,670 | 6/1984 | Nakayama et al. | 430/49 |
| 4,638,217 | 1/1987 | Okubo et al. | 250/423 R |

*Primary Examiner*—Carolyn E. Fields
*Assistant Examiner*—John A. Miller
*Attorney, Agent, or Firm*—Armstrong, Nikaido, Marmelstein & Kubovcik

[57] ABSTRACT

An ion emmisive head for fusing a metal to emit ion beam is disclosed, wherein a fused metal is designed to infiltrate through a porous portion for flow control and to reach an extremely sharpened needle which is provided after infiltration and wherefrom the fused metal is converted to ion beam by electrical action. Thus, ionized metallic beam is rendered to have smaller width or more focused ray. Submicron technology used in the IC industry, for instance, desires far thinner, finer beam line to attain more compact circuits, which need will be responded in the present invention by disposing a tipping needle to extend out of a porous tip portion which receives the fused metal from melting zone. Appropriate combination of sharpness at the needle point and provision of a beam guiding electrode in neighborhood of an emitting needle point enable to produce about 0.1 micron beam width by prevention of plasma ball which will otherwise diffuse the emitted beam.

2 Claims, 2 Drawing Sheets

ION EMMISSIVE HEAD AND ION BEAM IRRADIATION DEVICE INCORPORATING THE SAME

FIELD OF THE INVENTION

This invention relates to an ion emissive head and an ion beam irradiation system incorporating the same for various ionizable materials. Particularly, invention relates to an ion emissive head equipped with an ion guide needle at its tip position for drawing out a fused material to convert it into an ion beam and an ion beam irradiation system incorporating the same and related devices.

DESCRIPTION OF THE PRIOR ART

Recently, manufacture of integrated circuits on semiconductor chips, for instance, employs an ion irradiation apparatus with various metals at their fused status.

Ion emissive heads used in manufacture of integrated circuits are classed into two categories of needle and capillary types. The first needle type comprises a cylindrical pipe made of a material more refractory than the material to be ionized wherein a needle having a smaller diameter than the pipe is connected concentrically with at its bottom tipping position and wherein the needle, made of a refractory material, is provided with a needle point, formed generally in a cone having a diameter of from several $\mu$ (micron) to several tens $\mu$, being extended slightly out of the pipe end. And a needle type head is so designed that a fusible material to be ionized is stored in a some container located at upstream above the pipe and that, after fusion by heating, fused material will flow through void or gap between the pipe and the needle to be drawn out in the form of beam.

The capillary type is not equipped with a needle as noted above, but it comprises a refractory small pipe or a capillary and, upon heating, the fused material is allowed to bleed out to tip point of the capillary pipe and then will be drawn out as a beam.

In both types, upon application of a high voltage between the head and an accelerator electrode to be provided in fore proximity of the head, a strong electric field is consequently produced in the same fore proximity by which action the fused material staying the tip point will be converted into ion beam.

However, conventional ion emissive heads as noted above have not been rid of fluctuations in amount of drawn-out material in time during long run operation and therefore stable operation for generating or irradiating a uniform ion beam is not always attained for industrial purpose.

Another unsolved problem is occurrence of plasma ball which will come out in adjacent space of the beaming tip or in transition area from fused status to beam. This unfavorable phenomenon and the fluctuation in draw-out amount with conventional ion beam generating art are appraised to be casual to unattainment of creating a beam in a thinner line width with stable operating condition.

Thus, the non-uniformity in beam generation has been an impediment to manufacture of highly compacted electronic circuits in form of chip element in the semiconductor industry. Specifically, conventional ionizing art has been unsatisfactory to rapid progress in micro treatment technology which is desirous to attain more pointed or more focused beam with more stability. Conventionally, it is said that obtainment of about 0.5 $\mu$m beam line would be the smallest limit in beam width.

SUMMARY OF THE INVENTION

It is an object of the invention to provide an ion emissive head for emitting ion beam from a fusible material with stability to result in lines of sharp focus, avoiding possible occurrence of plasma ball in adjacent space to a beaming tip and thereby diffusion of beamed lines being prevented and further beam emission being stabilized.

Device for irradiating ion beam from a fused material of the present invention, therefore, comprises: a mount plate made of insulating material; a pair of electrodes, made of conductive material, mounted on the mount plate; an ion emissive head comprising a container to store a fusible material, preferably a metal selected from gold, gallium or aluminum, and to fuse it upon heating, a tip portion being formed of a porous refractor material and being connected with the container to allow the fused material to infiltrate through and to bleed out to end of the tip portion where the tip needle is embedded to extend its needle point out of the tip portion; an electrode provided in neighborhood of the extending needle end; and a wire heater connecting the ion emissive head and the pair of electrodes, thereby the bled-out fused material being controlled suitably in conversion to ions and wherein formation of plasma ball being prevented.

Hereinbelow the invention will be explained with reference to the attached drawings, but these drawings are presented by way of illustrating inventive embodiments, therefore these should not be construed as limiting the invention.

DESCRIPTION OF THE PREFERRED EMBODIMENTS

Figure 1:
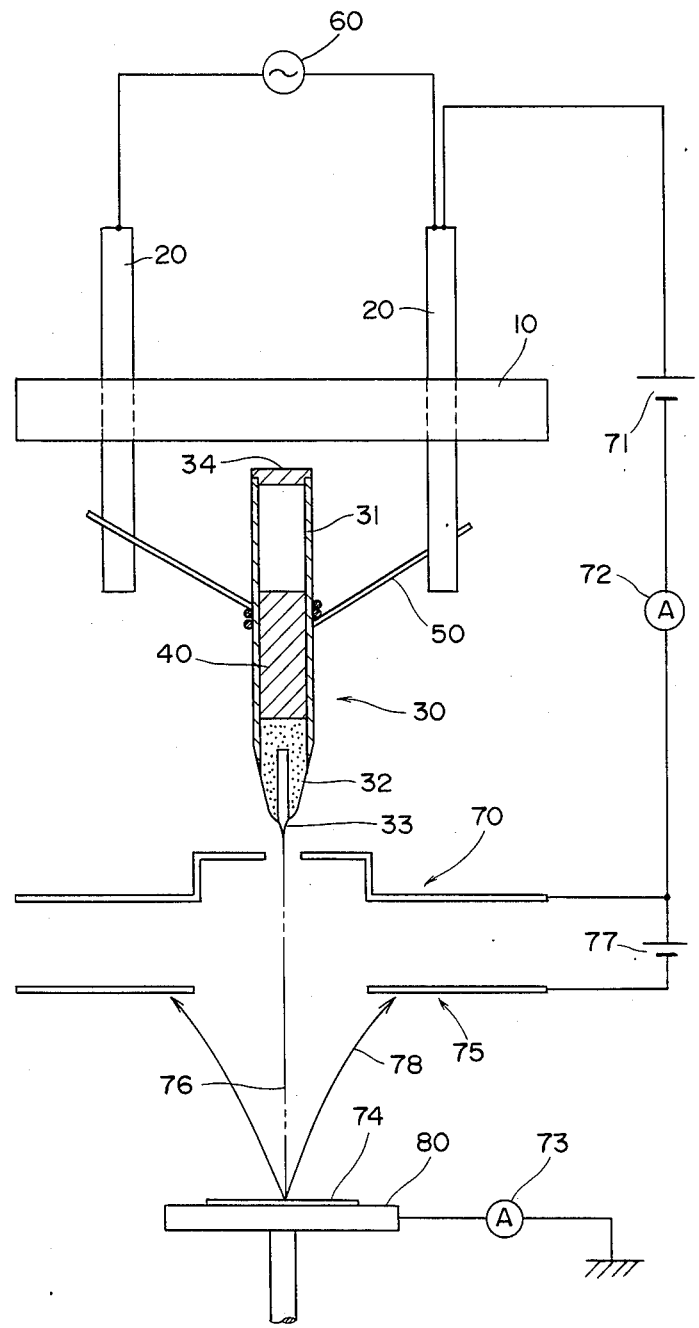
FIG. 1 is a not to-scale, schematic elevation diagram, partly broken, which is useful for explaining a systematic arrangement for irradiating ion beam of the invention, including an embodiment of the ion emissive head.

In FIG. 1, 10 is a mount plate made of an insulating material, for instance, a ceramic material and is formed to be a circular disk, and a pair of rod electrodes 20 made of electrically conductive material, for instance, Kovar (a brand name) are secured extending vertically through the plate with aid of, for instance, brazing wherein thermal expansion coefficient of the electrodes 20 is desirably made approximately equal to that of the mount plate 10. Electric source, AC, 60 is connected between the pair of electrodes 20 to heat an ion emissive head 30.

The ion emissive head 30 is of field emission type and it comprises; a cylindrical pipe container 31, made of more refractory or higher melting material, for instance, tungsten, to withstand in containing a material to be fused 40 (drawn in hatching), for instance, gallium, and to fusion by heating; a tip portion 32 in shape of generally downward cone (drawn in compact dots), formed of a body porous material, for instance, made of sintered metal, being insert-connected with bottom mouth of the pipe 31; and a needle 33 embedded in the tip portion 32 to protrude out its needle point wherein the needle 33, made of non-porous higher refractory material than the ionizing material 40, has an extremely sharpened point edge of about 0.1 to 0.005 μm which was finished by electropolishing.

The tip portion 32 is a porous metal body which is suitably manufactured by sintering a pulverulent metal having a higher melting point than the metal to be fused, after mixing it with a binder comprising alumina powder and nitro-cellulose, and therefore the fused metal 40 is allowed to infiltrate therethrough. And the binder to be added with a sintering metal, if pulverent tungsten being used, may be of alumina of 1 to 5 wt. % and nitro-cellulose of 2 to 4 wt. % based on wt. of the tungsten. Choice of a metal for the tip 32 may be normally made in a group of tungsten, molybdenum or nickel and is desirably a metal having good wettability with the fusing metal 40. Acceptable powder quality is normally in the range of several μ to several hundreds μ and it should be decided in connection with the fusing material and it may be a mixture of different sizes so as to perform good flow control of the fused material 40. In the case of ionizing gallium, the tip portion 32 is suitably manufactured from a half and half mixture of 100μ and 10μ tungsten powders.

As shown in FIG. 1, the pipe 31 has a lid 34 on another top mouth and space formed between the lid 34 and top of the tip portion 32 defines room for receiving the fusible material 40.

The pipe 31 in the ion emissive head 30 is wounded several turns on its surface with tungsten wire heater 50 which is fixed by suitable brazing and terminals of the wire heater 50 are connected with lower portions of the pair of electrodes 20. Further, in fore proximity of the end of the needle 33 of the head 30, an electrode 70 for guiding ions is provided to have an aperture commensurate with a diameter of the tip 32 and wherein an electric source, DC, 71 for the electrode 70 is set up to connect with the electrodes 20. In FIG. 1, 72 is a current measurement device and 73 is an ammeter to measure ion current, and 74 is a semiconductor substrate which is held on a holder plate 80 and will be irradiated by ionized metal beam 76. Disposed between the electrode 70 and the substrate 74 is a Farady cup 75 to catch secondary reflecting ions 78 from the substrate 74.

Below, appropriate operations of the embodiment noted above will be described.

First, a fusible metal 40 stored in the container 31 is heated by the wire heater 50 to be above its melting point for fusion. The fused ionizing material 40 flows down to infiltrate through the porous tip portion 32 and to bleed out to the under surface thereof, wherein flow amount of the fused 40 is controlled by temperature and size of metal particles or porosity defining the conic tip 32 and thereby the surface of the tip 32 will be wetted uniformly. Thereafter the fused 40 will reach the point edge of the needle 33. Then, application of a suitable voltage between the pipe 31 through the electrodes 20 and the guide electrode 71, will start beaming or emission of ions of the material from sharpened point of the tipping needle 33 and ions in the form of a beam line 76 bombard with acceleration onto the target semiconductor substrate 74. In the above operation, if the pointing edge of the tipping needle is made to have about 0.1 to 0.05 μm in diameter, emitted beam may be reduced down to about 0.1μ in diameter on a target substrate 74, which is proved by experimental operations.

Figure 2:
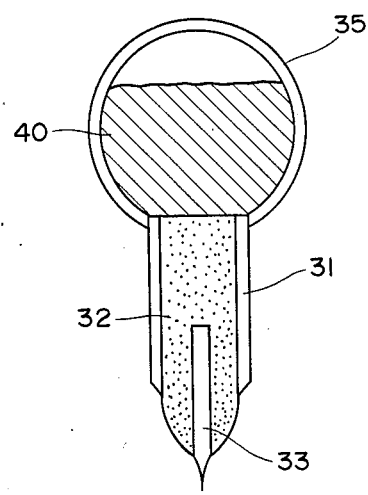
FIG. 2 shows another embodiment of the inventive ion emissive head.

The following may be added to descriptions of the invention noted hereinbefore: extension of the pipe 31 enables ready store of more amount of a fusible metallic material 40. And appropriate choice of particle size for the tip 32 enables longer duration of ion beaming operation; further, as shown in FIG. 2, the ion emissive head 31 may be varied or modified in such a manner that the head is shaped to be a upper spherical container portion 35 to store a fusible material 40, connected with a lower cylindrical pipe portion 31 whereinto the porous tip portion 32 is insert-connected to fully occupy internal space of the pipe portion 31.

We claim:

1. An ion emissive head for emitting an ion beam after fusion of a fusible material, which comprises:
   a container having a tip opening at one of its end and a mouth opening at its opposite end, said container being made of a refracting material more refracting than the fusible material for fusion therein;
   a tip portion inserted in said tip opening and forming a closure at said one end of said container, said tip portion being made of a porous refracting material and having the shape of a generally downward cone from said container;
   a needle partially embedded in the cone end of said tip portion and extending out of said cone end;
   a lid closing said mouth opening of said container and forming with said tip portion a storage space between said lid and said tip portion for said fusible material so that fused material infiltrates through said tip portion to said needle; said tip portion being a porous sintered body of a metal having a binder comprising aluminum powder and nitrocellulose and a pulverent metal more refractory than the fusible material to be fused therein and having good wettability with said fused material, the particle size of said pulverent metal being from several μm to several hundred μm.

2. Device for emitting an ion beam from a fused material, which comprises:
   a mount plate made of an insulating material;
   a pair of electrically conductive electrodes secured on said mount plate;
   a cylindrical ion emissive head having a porous tip portion, said head comprising means for storing a fusible material for fusing and infiltration through said porous tip portion and further allowing the fused material to bleed out onto a tipping needle, wherefrom said material will be drawn out of said tipping needle to an ion beam;
   a heating means for heating said ion emissive head;
   a pair of electrodes provided in forward proximity of the edge point of said tipping needle for guiding said ion beam; wherein said heating means is a wire heater wound on said cylindrical emissive head and electrically connected with said pair of electrodes.

* * * * *

UNITED STATES PATENT AND TRADEMARK OFFICE
CERTIFICATE OF CORRECTION

PATENT NO. : 4,774,413
DATED : September 27, 1988
INVENTOR(S) : Masao OKUBO et al It is certified that error appears in the above-identified patent and that said Letters Patent is hereby corrected as shown below:

On the cover page, Item [30], "October 23, 1986" should read --October 23, 1985--.

Signed and Sealed this

Twenty-first Day of March, 1989

Attest:

DONALD J. QUIGG

*Attesting Officer*  *Commissioner of Patents and Trademarks*